Dec. 5, 1961 M. E. DORCZAK ET AL 3,012,199

WIDE RANGE STEPPED HIGH VOLTAGE D.C. POWER SUPPLY

Filed June 17, 1960 2 Sheets-Sheet 1

INVENTORS
MICHAEL E. DORCZAK
IRVING T. BASIL
BY Wade Koontz
ATTORNEY
and
Richard J. Killoren
AGENT WIDE RANGE STEPPED HIGH VOLTAGE D.C. POWER SUPPLY
Filed June 17, 1960 2 Sheets-Sheet 2
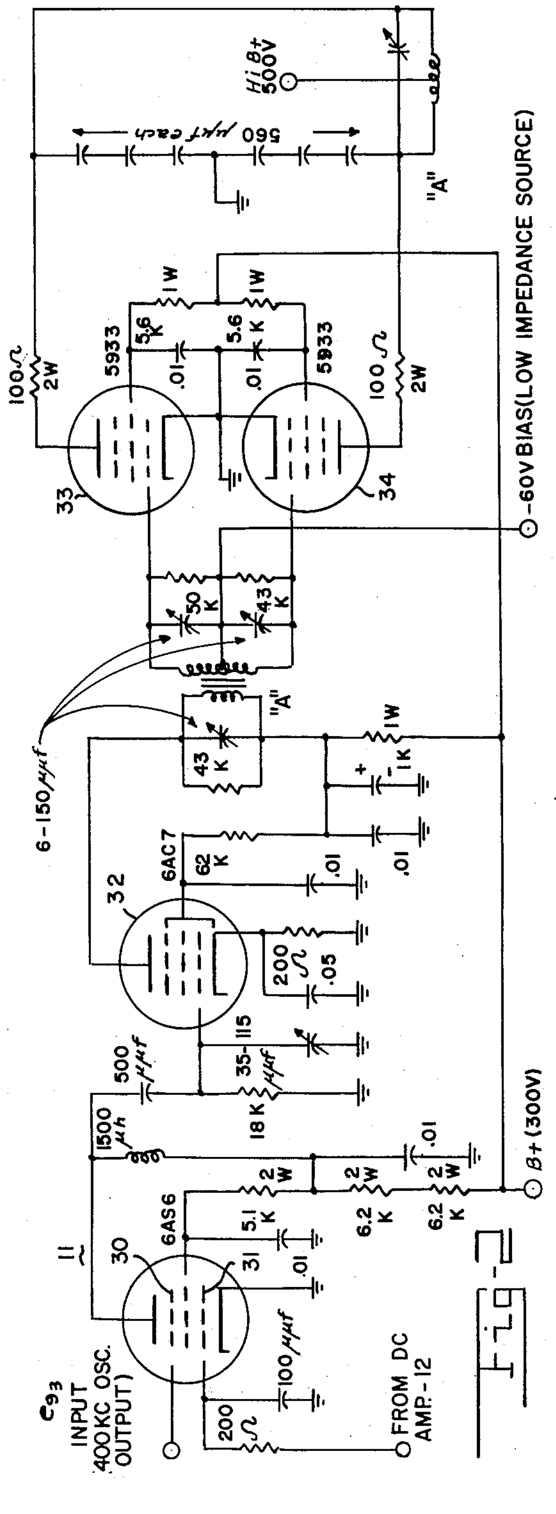
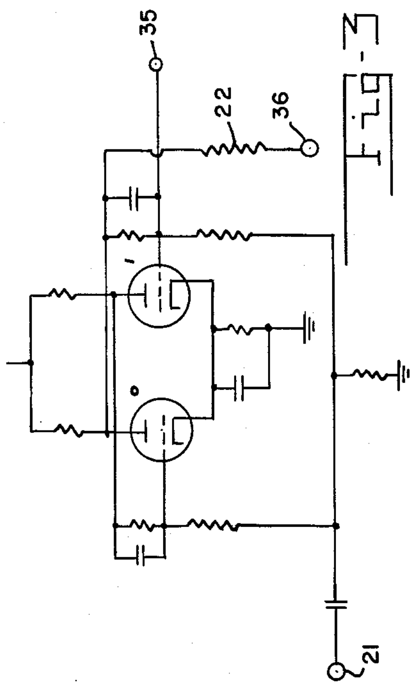
INVENTORS
MICHAEL E. DORCZAK
IRVING T. BASIL
BY Wade Koontz
ATTORNEY
and
Richard J. Killoren
AGENT 3,012,199

WIDE RANGE STEPPED HIGH VOLTAGE D.C. POWER SUPPLY

Michael E. Dorczak, Baltimore, and Irving T. Basil, Pikesville, Md., assignors to the United States of America as represented by the Secretary of the Air Force Filed June 17, 1960, Ser. No. 37,010
3 Claims. (Cl. 328—26)

This invention relates to a controlled high voltage direct current supply wherein the voltage varies over a wide range and wherein the voltage is stepped from one value to another in response to the pulses in a pulse train.

It is sometimes desirable to step a voltage tuned oscillator by discrete frequency steps through a wide frequency spectrum such as in searching a spectrum for counter measures information. In such a system the frequency must be known accurately and since the frequency is a function of voltage the voltage must be accurately controlled.

One object of the invention is to provide a step direct voltage source in which the various voltage levels may be accurately controlled.

This and other objects will be more fully understood from the following detailed description taken with the drawing wherein:

FIG. 2 is a circuit diagram for the variable gain amplifier and the radio frequency power amplifier of FIG. 1;

FIG. 3 is a circuit diagram for one of the counter stages for the device of FIG. 1.

Figure 1:
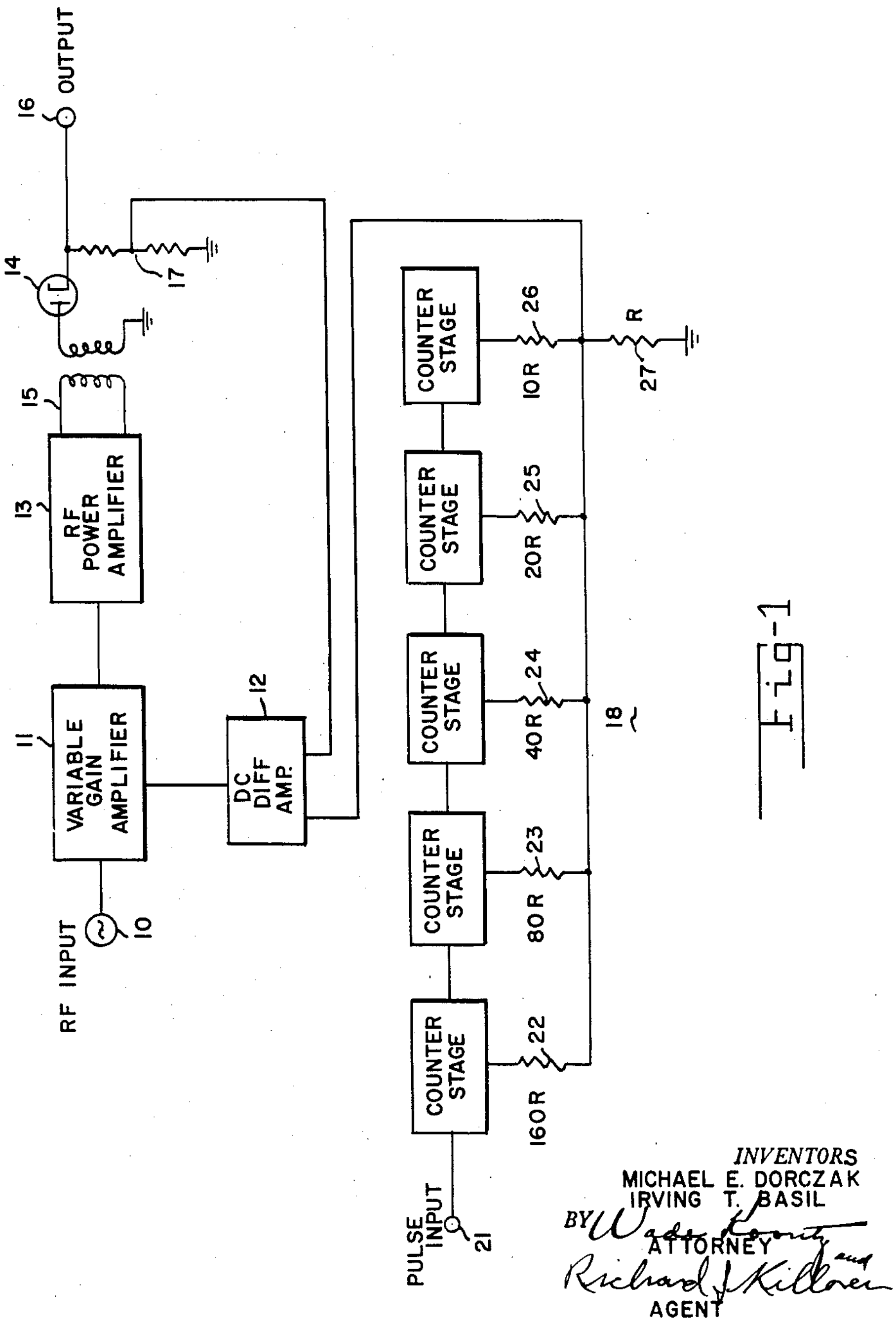
FIG. 1 is a block diagram of a step voltage direct current supply according to the invention.

Referring more particularly to FIGS. 1 and 2 of the drawing, the output of a radio frequency source 10 is applied to the suppressor grid 30, which acts as a second control grid, of a variable gain amplifier 11, wherein it is amplitude modulated by a D.C. output from the difference D.C. amplifier 12 applied to control grid 31. The output of the variable gain amplifier is amplified to driver stage 32 for push-pull output tubes 33 and 34 of a power amplifier 13. Because these stages amplify an amplitude modulated wave, they must have sufficient bandwidth to give the desired rise time. The output of the push-pull amplifier output tubes 33 and 34 is applied to a rectifier 14 through an output transformer 15 so that the output at 16 is proportional to the amplitude of the radio frequency carrier. The D.C. voltage which controls the gain of amplifier 11 is obtained by taking a portion of the output voltage off of voltage divider 17 and comparing it with the output of a binary counter 18, which is shown as a five stage. It is obvious that more or fewer stages may be used if desired. For example, to divide an output voltage range between —400 and —2400 into 64 steps a 32 stage counter is needed. The difference output voltage from D.C. amplifier 12, applied to variable gain amplifier 11, will cause the output at 16 to follow the step output voltage of counter 18 and thus the output is proportional to this voltage.

The step voltage supplied by the five stage counter 18 is proportional to the pulse input at 21. The output of the binary counter is weighted with summing resistors 22, 23, 24, 25 and 26 working with resistor 27 to give an output voltage proportional to the count of the pulses applied at 21. A circuit which may be used for the individual counting stages is shown in FIG. 3, with the output to the succeeding stages being taken off at 35 and the output to the adder being taken off at 36. Resistor 22 is shown in this figure.

There is thus provided a controlled D.C. supply wherein the output is made to vary over a large range and wherein the voltage is stepped from one value to another in response to the pulses in a pulse train.

While one specific embodiment is described in some detail, it is obvious that numerous changes may be made without departing from the general principles and scope of the invention.

We claim:

1. A stepped high voltage direct current supply comprising: a variable gain amplifier, means for applying a radio frequency signal to said variable gain amplifier, means for amplifying the output of said variable gain amplifier, means for rectifying the amplified output of said variable gain amplifier to thereby produce a direct voltage output, a plural stage counter, a summing circuit in the output of said counter, means for applying a pulse signal to said counter, means for comparing a portion of said direct voltage output with the output of said summing circuit to thereby produce a difference control voltage and means for applying said difference control voltage to said variable gain amplifier to amplitude modulate said radio frequency signal to thereby cause said direct voltage output to follow the output of said summing circuit.

2. A stepped high voltage direct current supply comprising: a variable gain amplifier having a cathode, an anode, and a first and second control grid, means for applying a radio frequency signal to the first grid of said variable gain amplifier, means for amplifying the output of said variable gain amplifier, means for rectifying the amplified output of said variable gain amplifier to thereby produce a direct voltage output, a plural stage counter, a summing circuit in the output of said counter, means for applying a pulse signal to said counter, means for comparing a portion of said direct voltage output with the output of said summing circuit to thereby produce a difference control voltage and means for applying said difference control voltage to the second control grid of said variable gain amplifier to amplitude modulate said radio frequency signal to thereby cause said direct voltage output to follow the output of said summing circuit.

3. A stepped high voltage direct current supply comprising: a variable gain amplifier having a cathode, an anode, a suppressor grid and a control grid, means for applying a radio frequency signal to the said suppressor grid of said variable gain amplifier, a radio frequency power amplifier means for applying the output of said variable gain amplifier to said power amplifier, means for rectifying the amplified output of said variable gain amplifier to thereby produce a direct output voltage, a voltage divider connected in the output circuit of said rectifying means, a plural stage counter, a summing circuit in the output of said counter, means for applying a pulse signal to said counter, a direct current difference amplifier having a first and second input terminal, means for applying an output from said voltage divider to the first terminal of said difference amplifier, means for applying the output of said summing circuit to the second input of said difference amplifier and means for applying the output of said difference amplifier to the control grid of said variable gain amplifier to amplitude modulate said radio frequency signal to thereby cause said direct output voltage to follow the output of said summing circuit.

References Cited in the file of this patent

UNITED STATES PATENTS

| | | |
|---|---|---|
| 2,796,314 | Bishop et al. | June 18, 1957 |
| 2,902,658 | Erdman | Sept. 1, 1959 |
| 2,924,712 | Edens | Feb. 9, 1960 |